United States Patent [19]

Tsukada

[11] Patent Number: 5,521,547

[45] Date of Patent: May 28, 1996

[54] BOOST VOLTAGE GENERATING CIRCUIT

[75] Inventor: Shyuichi Tsukada, Tokyo, Japan

[73] Assignee: NEC Corporation, Tokyo, Japan

[21] Appl. No.: 485,144

[22] Filed: Jun. 7, 1995

Related U.S. Application Data

[63] Continuation of Ser. No. 352,815, Dec. 1, 1994, abandoned, which is a continuation of Ser. No. 80,517, Jun. 24, 1993, abandoned.

[30] Foreign Application Priority Data

Jun. 24, 1992 [JP] Japan .................................. 4-165209

[51] Int. Cl.$^6$ ........................................................ G05F 1/10
[52] U.S. Cl. ......................... 327/537; 327/589; 327/543
[58] Field of Search ................................ 307/482, 279,
307/296.2, 296.5, 296.1, 296.6, 296.8; 365/189.05,
203, 189.9; 327/537, 538, 540, 541, 543,
544, 589, 545, 546, 143, 208, 390

[56] References Cited

U.S. PATENT DOCUMENTS

| | | | |
|---|---|---|---|
| 3,808,468 | 4/1974 | Ludlow et al. | 307/296.2 |
| 4,412,143 | 10/1983 | Patella et al. | 307/530 |
| 4,742,250 | 5/1988 | Tobita | 307/296.2 |
| 4,775,806 | 10/1988 | Pfennings et al. | 307/296.6 |
| 4,843,256 | 6/1989 | Scade et al. | 307/296.2 |
| 4,922,128 | 5/1990 | Dhong et al. | 327/589 |
| 4,954,731 | 9/1990 | Dhong et al. | 327/294 |
| 4,973,864 | 11/1990 | Nogami | 327/208 |
| 5,023,465 | 6/1991 | Douglas et al. | 307/296.2 |
| 5,126,590 | 6/1992 | Chern | 307/296.1 |
| 5,140,182 | 8/1992 | Ichimura | 307/296.5 |

OTHER PUBLICATIONS

Y. Nakagome et al., "A 1.5V Circuit Technology for 64Mb DRAMs", 1990 Symposium on VLSI Circuits, pp. 17–18.

*Primary Examiner*—Timothy P. Callahan
*Assistant Examiner*—My-Trang Nu Ton
*Attorney, Agent, or Firm*—Sughrue, Mion, Zinn, Macpeak & Seas

[57] ABSTRACT

A boost voltage generating circuit includes a boost voltage producing circuit having a first and a second capacitor receiving a first and a second control signal, respectively, a third smoothing capacitor connected at an output terminal, and a first, a second, a third, and a fourth transistor. A boost output voltage is derived through the third and fourth transistors. The boost voltage producing circuit further includes a fourth capacitor connected between the first capacitor and the gate of the third transistor; a fifth capacitor connected between the second capacitor and the gate of the fourth transistor; a fifth transistor having one of a source and a drain connected to the first capacitor with the other thereof connected to the gate of the third transistor and a gate connected to the second capacitor; and a sixth transistor having one of a source and a drain connected to the second capacitor with the other thereof connected to the gate of the fourth transistor and a gate connected to the first capacitor. The arrangement enables to maintain the gate potential of the third and fourth transistors above a predetermined level, thereby preventing the lowering of current driving capability of these transistors and the lowering of current supplying capability for a boost potential.

8 Claims, 4 Drawing Sheets

FIG. IA
PRIOR ART
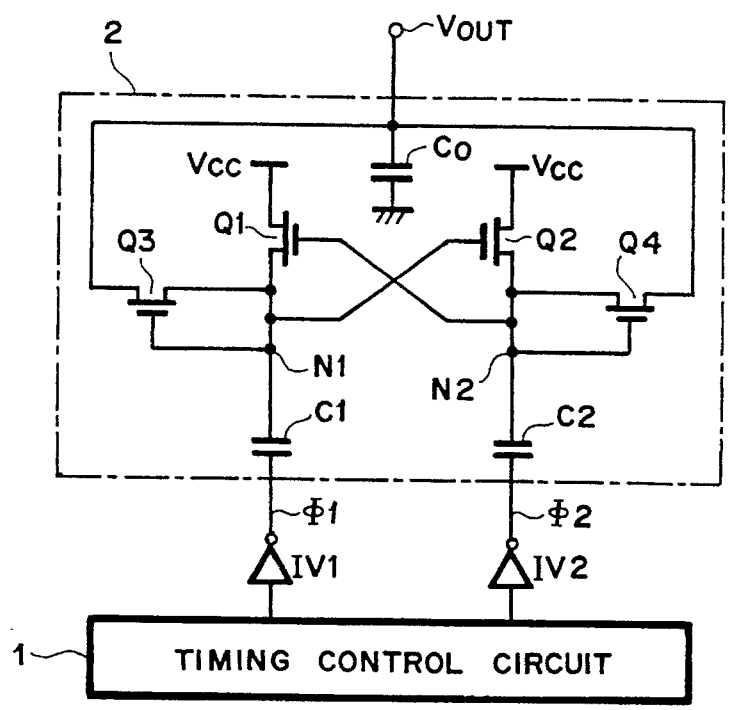
FIG. IB
PRIOR ART
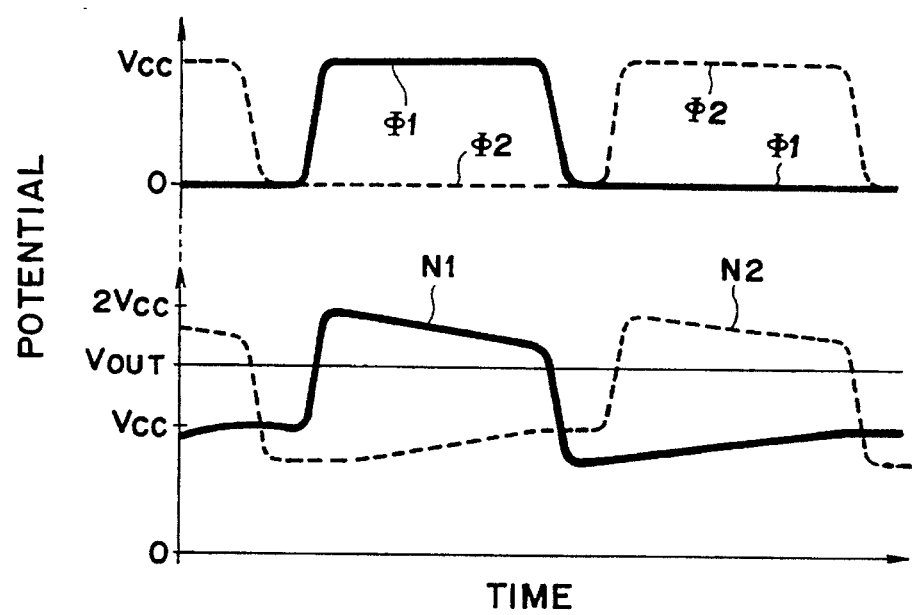

BOOST VOLTAGE GENERATING CIRCUIT

This is a continuation of application No. 08/352,815 filed on Dec. 1, 1994, now abandoned, which is a continuation of application No. 08/080,517 filed on Jun. 24, 1993, now abandoned.

BACKGROUND OF THE INVENTION

1. Field of the Invention

The present invention relates to a boost voltage generating circuit, and more particularly to a boost voltage generating circuit for producing a boost potential for a word line of a semiconductor memory device or of a substrate potential for a semiconductor integrated circuit.

2. Description of the Related Art

An example of the conventional boost voltage generating circuit of the kind to which the present invention relates is shown in FIG. 1A and the waveforms obtained at various points therein are shown in FIG. 1B.

The conventional boost voltage generating circuit referred to above is constituted by a timing control circuit 1 and a boost voltage producing section 2. The timing control circuit 1 outputs a first control signal Φ1 and a second control signal Φ2 respectively through an output node of an inverter IV1 and an output node of an inverter IV2. The first control signal Φ1 becomes a power supply potential ($V_{CC}$) level and a reference potential (ground potential) level in a predetermined cycle, and the second control signal Φ2 becomes a power supply potential level for a predetermined period within the period of the reference potential level of the first control signal Φ1 and becomes a reference potential level outside the period of the power supply potential level. The boost voltage producing section 2 includes first and second capacitor elements C1 and C2 which receive respectively the first and second control signals Φ1 and Φ2 at their first ends; a first N-channel field effect transistor Q1 in which one of a source and a drain is connected to the power supply potential terminal ($V_{CC}$), the other of the source and the drain is connected to a second end of the first capacitor element C1, and a gate is connected to the second end of the second capacitor element C2; a second N-channel transistor Q2 in which one of a source and a drain is connected to the power supply potential terminal $V_{CC}$, the other of the source and the drain is connected to the second end of the second capacitor element C2, and a gate is connected to the second end of the first capacitor element C1; a third N-channel transistor Q3 in which one of a source and a drain, and a gate are connected to the second end of the first capacitor element C1, and the other of the source and the drain is connected to a boost potential output terminal $V_{OUT}$ ($V_{OUT}$ also representing the boost potential); a fourth N-channel transistor Q4 in which one of a source and a drain, and a gate are connected to the second end of the second capacitor element C2, and the other of the source and the drain is connected to the boost potential output terminal $V_{OUT}$; and a third capacitor element $C_O$ having a large capacitance which is connected between the boost potential output terminal $V_{OUT}$ and the reference potential terminal.

The operation of the above explained boost voltage generating circuit is as follows.

When the control signal Φ1 is at the power supply potential level $V_{CC}$ and the control signal Φ2 is at the ground potential level (0 V), the transistor Q2 turns ON so that the node N2 at the second end of the second capacitor element C2 is charged and becomes the power supply potential $V_{CC}$.

Also, if the node N1 at the second end of the first capacitor element C1 is at a level higher than $V_{OUT}$+ $V_T$ ($V_T$ being the threshold voltage of the transistor), the current flows from the node N1 to the boost potential output terminal $V_{OUT}$ through the transistor Q3 and thus the boost potential $V_{OUT}$ is raised to a level higher than the power supply potential $V_{CC}$.

Next, contrary to the above, when the control signal Φ1 turns to the ground potential level and the control signal Φ2 turns to the power supply potential level, the potential at the node N2 rises close to 2 $V_{CC}$ whereby the transistor Q1 becomes ON and the node N1 is charged up to the level of the power supply potential $V_{CC}$. Also, the charges are supplied to the boost potential output terminal $V_{OUT}$ through the transistor Q4.

The above operation is repeated and, after being smoothed by the capacitor element $C_O$ having a large capacitance, the boost voltage $V_{OUT}$ is raised to a potential higher than the power supply potential $V_{CC}$.

The boost voltage $V_{OUT}$ thus obtained is used for such purposes as for select-level driving of word lines of a semiconductor memory device. Also, when the P-channel transistors are employed and the potentials at various points are reversed, it is possible to obtain the substrate potential to be applied to the substrate of a semiconductor integrated circuit.

In the boost voltage generating circuit described above, since the charges of the capacitor element C1 are supplied to the boost potential output terminal $V_{OUT}$ through the transistor Q3 when the control signal Φ1 is at the power supply potential level $V_{CC}$, the level at the node N1 gradually lowers starting from about 2 $V_{CC}$ as shown in FIG. 1B. Therefore, the ON-resistance of the transistor Q3 whose gate is directly connected to the node N1 becomes greater, resulting in the lowering of the current driving capability so that, although it is possible to boost the boost potential $V_{OUT}$ almost to 2 $V_{CC}$ minus $V_T$, the current supply capability largely drops once the boost potential $V_{OUT}$ is set to a high level.

SUMMARY OF THE INVENTION

It is, therefore an object of the invention to overcome the problems existing in the prior art and to provide an improved boost voltage generating circuit in which the current supply capability for boost voltage potentials is enhanced.

According to one aspect of the invention there is provided a boost voltage generating circuit having a timing control circuit and a boost voltage producing circuit, the timing control circuit being for generating a first control signal to become a power supply potential level and a reference potential level at a predetermined cycle and a second control signal to become the power supply potential level during a predetermined period within a period of the reference potential level of the first control signal and become the reference potential level during a period outside the period of the reference potential level, the boost voltage producing circuit including a first and a second capacitor element receiving respectively at their first ends the first and second control signals, a first transistor having either a source or a drain connected to a power supply potential node with the other of the source and the drain connected to a second end of the first capacitor element and a gate connected to a second end of the second capacitor element, a second transistor having either a source or a drain connected to the power supply potential node with the other of the source and the drain connected to the second end of the second capacitor element and a gate connected to the second end of the first capacitor element, a third transistor having either a source or a drain connected to the second end of the first capacitor element with the other of the source and the drain connected to a boost potential output terminal, a fourth transistor having either a source or a drain connected to the second end of the capacitor element with the other of the source and the drain connected to the boost potential output terminal, and a third capacitor element connected between the boost potential output terminal and a reference potential node, the boost voltage producing circuit further comprising:

a fourth capacitor element connected between the first end of the first capacitor element and the gate of the third transistor;

a fifth capacitor element connected between the first end of the second capacitor element and the gate of the fourth transistor;

a fifth transistor having either a source or a drain connected to the second end of the first capacitor element with the other of the source and the drain connected to the gate of the third transistor and a gate connected to the second end of the second capacitor element; and a sixth transistor having either a source or a drain connected to the second end of the second capacitor element with the other of the source and the drain connected to the gate of the fourth transistor and a gate connected to the second end of the first capacitor element.

BRIEF DESCRIPTION OF THE DRAWINGS

The above and other objects, features and advantages of the present invention will be apparent from the following description of preferred embodiments of the invention explained with reference to the accompanying drawings, in which:

FIG. 1A is a circuit diagram showing a conventional boost voltage generating circuit and FIG. 1B is a chart showing operating waveforms at various points therein;

PREFERRED EMBODIMENTS OF THE INVENTION

Now, explanation is made of preferred embodiments of the invention with reference to the accompanying drawings. It should be noted that, throughout the explanation, similar reference symbols or numerals refer to the same or similar elements in all the figures of the drawings.

Figure 2A:
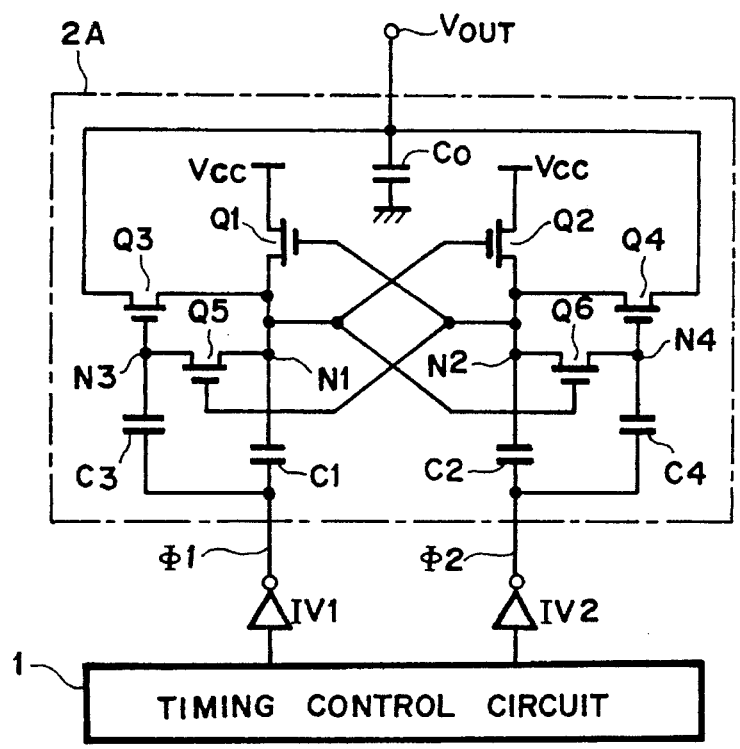
FIG. 2A is a circuit diagram showing a boost voltage generating circuit of a first embodiment according to the invention and FIG. 2B is a chart showing operating waveforms at various points therein.
Figure 2B:
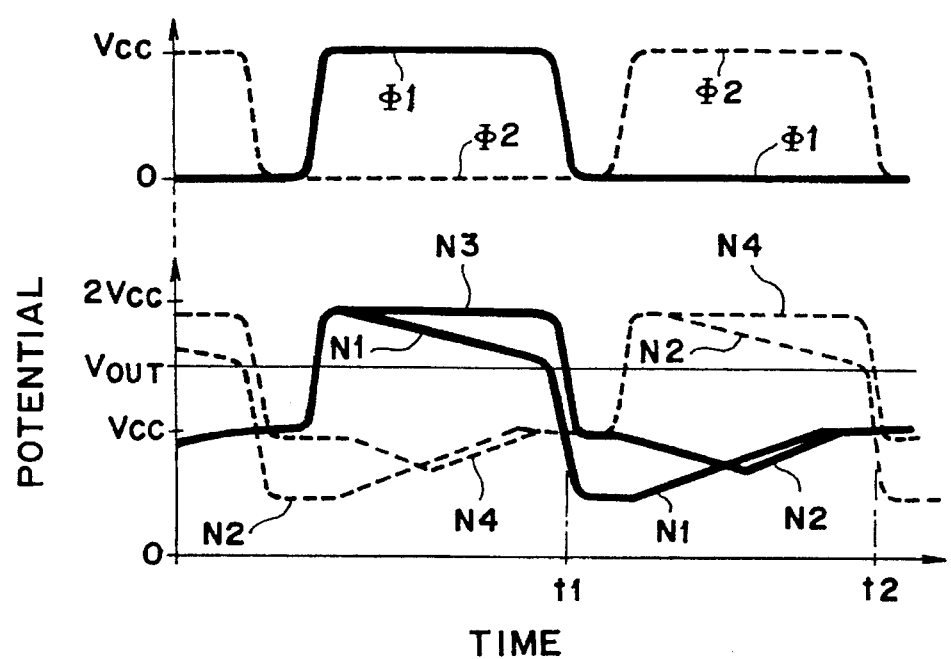

FIG. 2A shows in circuit diagram a first embodiment of the invention and FIG. 2B shows operating waveforms at various points in the circuit of the first embodiment.

The differences in the boost voltage generating circuit of this embodiment as compared with the conventional circuit shown in FIGS. 1A and 1B reside in the provision of a fourth capacitor element C3, a fifth capacitor element C4, a fifth field effect transistor Q5, and a sixth field effect transistor Q6. The fourth capacitor element C3 is connected between the first end of the first capacitor element C1 and the gate of the third transistor Q3. The fifth capacitor element C4 is connected between the first end of the second capacitor element C2 and the gate of the fourth transistor Q4. As to the fifth transistor Q5, one of a source and a drain is connected to the second end of the first capacitor element C1, the other of the source and the drain is connected to the gate of the third transistor Q3, and a gate is connected to the second end of the second capacitor element C2. As to the sixth transistor Q6, one of a source and a drain is connected to the second end of the second capacitor element C2, the other is connected to the gate of the fourth transistor Q4, and a gate is connected to the second end of the first capacitor element C1.

Next, the operation of the circuit according to this embodiment Is explained.

When the control signal $\Phi1$ turns to the power supply potential level $V_{CC}$ and the control signal $\Phi2$ turns to the ground potential level, the node N1 and the node N3 rise almost to $2 V_{CC}$ so that the transistor Q3 turns ON and thus the current flows from the node N1 to the boost potential output terminal $V_{OUT}$. Thus, although the potential at the node N1 gradually drops, the node N3 continues to maintain a high potential because the transistor Q5 is in an ON state. Also, the transistor Q6 is in an ON state, so that the gate of the transistor Q4, that is, the node N4 are precharged to the potential at the node N2 with a consequence that the transistor Q4 is turned OFF. Next, when the control signal $\Phi1$ turns to the ground potential level and the control signal $\Phi2$ turns to the power supply potential level, the transistor Q1 is caused to turn ON and the node N1 is charged up to the power supply potential $V_{CC}$, the transistor Q5 turns ON, the node N3 is precharged to a potential which equals that at the node N1, and the transistor Q3 turns OFF. Further, since the potentials at the node N2 and tile node N4 have risen to approximately $2 V_{CC}$ and the transistor Q4 turns ON, the current is supplied to the power supply potential terminal $V_{CC}$ from the node N2 so that, although the potential of the node N2 gradually drops, it should be noted that the node N4 is maintained at the high potential.

As explained above, even when the potential drops due to the current flow from the nodes N1 and N2 to the boost potential output terminal $V_{OUT}$, the gate potentials of the transistor Q3 and the transistor Q4 are maintained at high potentials, whereby the possibility of lowering the current driving capability is minimized and the current supplying capability is significantly increased.

Figure 3A:
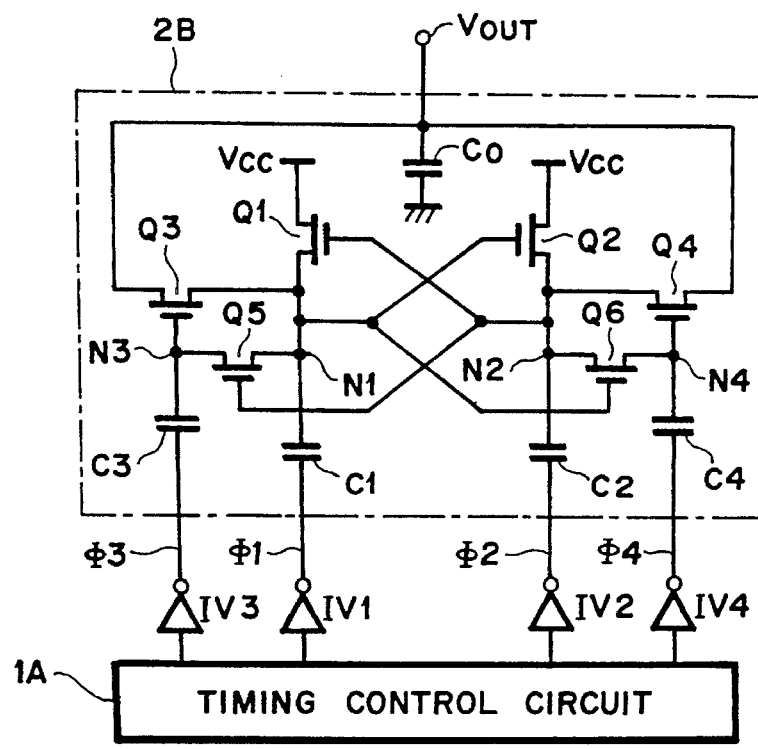
FIG. 3A is a circuit diagram showing a boost voltage generating circuit of a second embodiment according to the invention and FIG. 3B is a chart showing operating waveforms at various points therein.
Figure 3B:
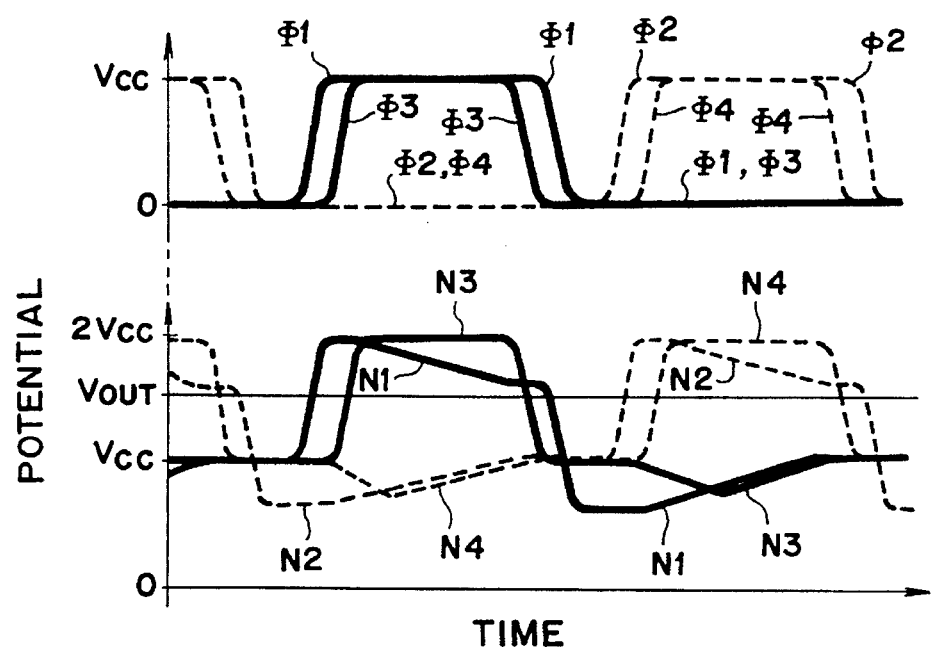

FIG. 3A is a circuit diagram showing a boost voltage generating circuit according to the second embodiment of the invention and FIG. 3B is a diagram showing operating waveforms at various points in the circuit. In the above explained first embodiment, at the timings t1 and t2 in FIG. 2B, there is a possibility that the currents may momentarily flow in a reverse direction from the boost potential output terminal $V_{OUT}$ to the nodes N1 and N2 respectively through the transistors Q3 and Q4. This results in wasting power dissipation. The second embodiment of the invention is intended to solve this problem.

According to this second embodiment, the timing control circuit 1A generates through inverters IV3 and IV4 a third control signal $\Phi3$ and a fourth control signal $\Phi4$ in addition to the first and second control signals $\Phi1$ and $\Phi2$. This second embodiment is different from the first embodiment in that the first ends of the fourth and fifth capacitor elements C3 and C4 receive the third and fourth control signals Φ3 and Φ4, respectively, in place of the first and second control signals Φ1 and Φ2. The control signal Φ3 turns to a power supply potential level after the level of the first control signal Φ1 becomes the power supply potential level, and turns to a ground potential level before the level of the first control signal Φ1 becomes the ground potential level. The control signal Φ4 turns to the power supply potential level after the level of the second control signal Φ2 becomes the power supply potential level and turns to the ground potential level before the level of the second control signal Φ2 becomes the ground potential level. The above third control signal Φ3 is supplied to the first end of the fourth capacitor element C3, which end is separated from the first end of the first capacitor element C1 in the first embodiment shown in FIG. 2A. In the same manner, the fourth control signal Φ4 is supplied to the first end of the fifth capacitor element C4, which end is separated from the first end of the second capacitor element C2 in the first embodiment shown in FIG. 2A.

Consequently, when the transistor Q3 turns ON, the level at the node N1 definitely becomes the power supply potential level and, when the transistor Q4 turns ON, the level of the node N4 definitely becomes the power supply potential level. Thus, it is possible to prevent the reverse flow of the current from the boost potential output terminal $V_{OUT}$ to the nodes N1 and N2, so that there is no waste of power unlike in the first embodiment shown in FIG. 2A.

Figure 4A:
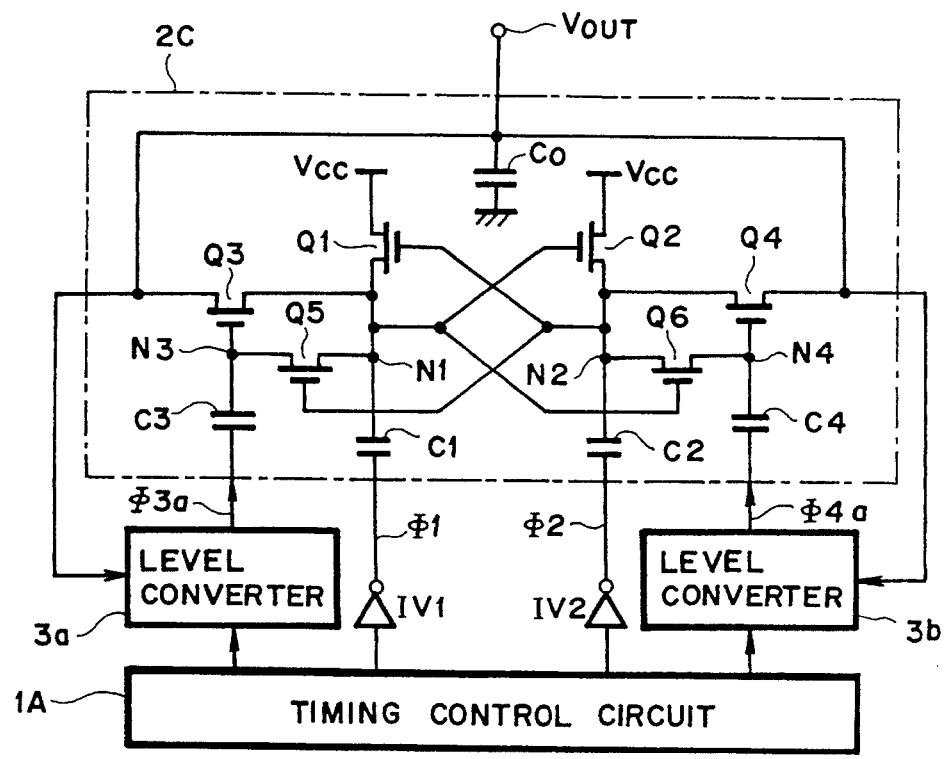
FIG. 4A is a circuit diagram showing a boost voltage generating circuit of a third embodiment according to the invention and FIG. 4B is a chart showing operating waveforms at various point therein.
Figure 4B:
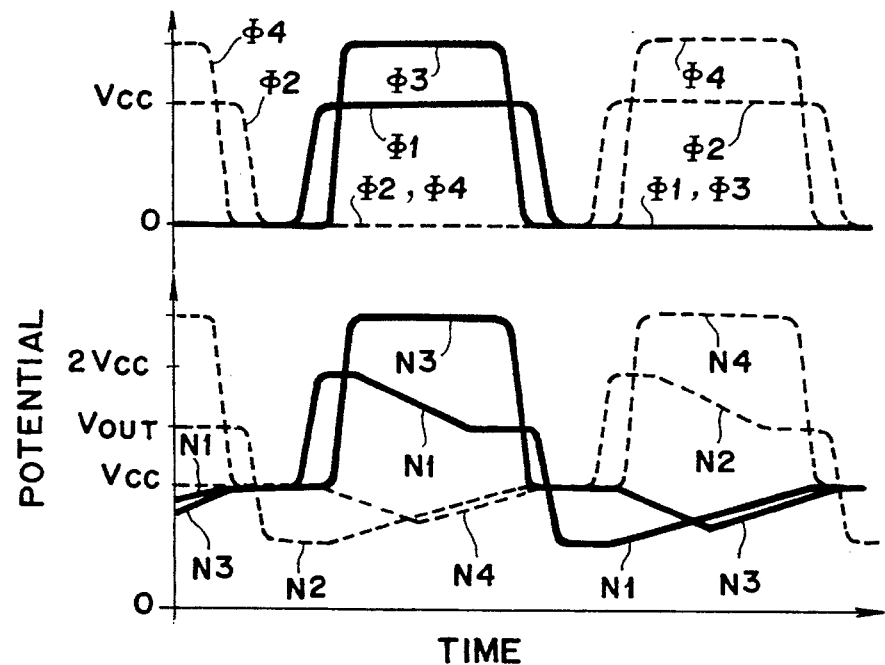

FIG. 4A diagrammatically shows a boost voltage generating circuit of a third embodiment according to the invention, and FIG. 4B shows operating waveforms at various points in such circuit.

In the circuits of the first and second embodiments, the gate level of each of the transistors Q3 and Q4 when it turns ON is in the order of 2 $V_{CC}$. Strictly speaking, the gate level is lower than 2 $V_{CC}$ by the potential which is determined by the ratio between the capacitance of each of the capacitor elements C3, C4 and the gate capacitance of each of the transistors Q3, Q4. As the capacitance of the capacitor elements C3 and C4 increases from the gate capacitance of each of the transistors Q3 and Q4, the gate potential or level will become closer to 2 $V_{CC}$. However, the boost voltage $V_{OUT}$ will be, even at its maximum, a voltage lower by the threshold voltage $V_T$ of the transistor than a voltage at tile state when the gate potential of the transistors Q3 and Q4 is at the power supply potential. This means that the gate level can be raised only close to (2 $V_{CC}$−$V_T$). The circuit of the third embodiment has improved this point, whereby the gate potential can be raised at the maximum up to almost 2 $V_{CC}$.

The circuit of the third embodiment is provided with level conversion circuits 3a and 3b in addition to the circuit configuration of the second embodiment shown in FIG. 3A. These level conversion circuits 3a and 3b generate respectively a level-converted third control signal Φ3a and a level-converted fourth control signal Φ4a of high levels in which the power supply potential levels of the third control signal Φ3 and the fourth control signal Φ4 are made higher respectively by predetermined levels. Each of these high level third and fourth control signals Φ3a and 3b is inputted to the corresponding first end of the fourth and fifth capacitor elements C3 and C4.

The control signals Φ3a and Φ4a are produced by buffering the outputs from the timing control circuit 1A at the level conversion circuits 3a and 3b. At this time, the boost voltage potential $V_{OUT}$ is inputted to the level conversion circuits 3a and 3b as an output power supply, whereby the levels of the control signals Φ3a and Φ4a become boosted voltage levels and thus the high levels at the nodes N3 and N4 rise almost to ($V_{CC}$+$V_{OUT}$). Since the gate levels of the transistors Q3 and Q4 can be raised to the levels higher than those in the circuits of the first and second embodiments, the current driving capability of the transistors Q3 and Q4 becomes large allowing the boost voltage potential $V_{OUT}$ to rise close to 2 $V_{CC}$ at the maximum.

As explained above, according to the invention, the gate potential levels of the third and fourth transistors are maintained above the predetermined levels by the provision of the fifth and sixth transistors and the fourth and fifth capacitor elements. This enables to prevent the lowering of the current driving capability of the third and fourth transistors and also to prevent the lowering of the current supplying capability for the boost potential, which results in the following advantages:

(1) Where the current supply required is the same as that in the prior art, the size of each of the transistors and the capacitor elements can be made smaller so that, in designing a circuit, the area to be occupied by the circuit can be reduced.

(2) By making the size of each transistor smaller, the current for driving the circuit can be reduced and the current conversion efficiency [=(current supplied to $V_{OUT}$)/(current dissipation from $V_{CC}$)] can be enhanced.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A boost voltage generating circuit comprising:

a timing control circuit and a boost voltage producing circuit, wherein said timing control circuit generates a first control signal which alternates between a power supply potential level and a reference potential level at a predetermined cycle and a second control signal, wherein said second control signal is equal to said power supply potential level during a predetermined period within a first period when said first control signal is equal to said reference potential level, wherein said second control signal is equal to said reference potential level during a period outside said first period, and wherein said boost voltage producing circuit comprises:

a first and a second capacitor element which respectively receive at their first ends said first and second control signals;

a first transistor having either a source or a drain connected to a power supply potential node with the other of said source and said drain connected to a second end of said first capacitor element and a gate connected to a second end of said second capacitor element;

a second transistor having either a source or a drain connected to said power supply potential node with the other of said source and said drain connected to the second end of said second capacitor element and a gate connected to the second end of said first capacitor element;

a third transistor having either a source or a drain connected to the second end of said first capacitor element with the other of said source and said drain connected to a boost potential output terminal;

a fourth transistor having either a source or a drain connected to the second end of said second capacitor element with the other of said source and said drain connected to said boost potential output terminal;

a third capacitor element connected between said boost potential output terminal and a reference potential node;

a fourth capacitor element connected between the first end of said first capacitor element and a gate of said third transistor;

a fifth capacitor element connected between the first end of said second capacitor element and a gate of said fourth transistor;

a fifth transistor having either a source or a drain connected to the second end of said first capacitor element with the other of said source and said drain connected to the gate of said third transistor and a gate connected to the second end of said second capacitor element; and a sixth transistor having either a source or a drain connected to the second end of said second capacitor element with the other of said source and said drain connected to the gate of said fourth transistor and a gate connected to the second end of said first capacitor element.

2. A boost voltage generating circuit according to claim 1, wherein said timing control circuit further generates a third control signal and a fourth control signal, wherein said third control signal alternates between said power supply potential level and said reference potential level, wherein said third control signal switches from said reference potential level to said power supply potential level after said first control signal switches from said reference potential level to said power supply potential level, wherein said third control signal switches from said power supply potential level to said reference potential level before said first control signal switches from said power supply potential level to said reference potential level, wherein said fourth control signal alternates between said power supply potential level and said reference potential level, wherein said fourth control signal switches from said reference potential level to the power supply potential level after said second control signal switches from said reference potential level to the power supply potential level, wherein said fourth control signal switches from said power supply potential level to the reference potential level before said second control signal switches from said power supply potential level to the reference potential level, wherein a first end of said fourth capacitor element is separated from said first end of said first capacitor element and receives said third control signal, and wherein a first end of said fifth capacitor element is separated from said first end of said second capacitor element and receives said fourth control signal.

3. A boost voltage generating circuit according to claim 2, further comprising:

a first level conversion circuit which converts said third control signal into a level-converted third control signal by increasing a potential of said third control signal by a predetermined level when said potential of said third control signal is equal to said power supply level; and a second level conversion circuit which converts said fourth control signal into a level-converted fourth control signal by increasing a potential of said fourth control signal by a predetermined level when said potential of said fourth control signal is equal to said power supply level, wherein said level-converted third control signal is input to the first end of said fourth capacitor element and said level-converted fourth control signal is input to the first end of said fifth capacitor element.

4. A boost voltage generating circuit according to claim 1, wherein said first through sixth transistors are N-channel field effect transistors.

5. A boost voltage generating circuit comprising:

a first, a second, a third and a fourth input terminal receiving a first, a second, a third and a fourth timing control signal, respectively;

an output terminal;

a first, a second, a third and a fourth circuit node;

a power terminal;

a first transistor having a gate connected with said second circuit node, and a source and a drain coupled between said power terminal and said first circuit node;

a second transistor having a gate connected with said first circuit node, and a source and a drain coupled between said power terminal and said second circuit node;

a third transistor having a gate connected with said third circuit node, and a source and a drain coupled between said first circuit node and said output terminal;

a fourth transistor having a gate connected with said fourth circuit node, and a source and a drain coupled between said second circuit node and said output terminal;

a fifth transistor having a gate connected with said second circuit node, and a source and a drain coupled between said first and said third circuit nodes;

a sixth transistor having a gate connected with said first circuit node, and a source and a drain coupled between said second and said fourth circuit nodes;

a first capacitor coupled between said first input terminal and said first circuit node;

a second capacitor coupled between said second input terminal and said second circuit node;

a third capacitor coupled between said third input terminal and said third circuit node; and a fourth capacitor coupled between said fourth input terminal and said fourth circuit node.

6. A boost voltage generating circuit according to claim 5, wherein said first and said third input terminals are connected to each other and said first and said third timing control signals are the same timing control signal, and wherein said second and said fourth input terminals are connected to each other and said second and said fourth timing control signals are the same timing control signal.

7. A boost voltage generating circuit according to claim 5, wherein said first and said third input terminals are separate input terminals and said third timing control signal rises to a high potential level during a period when said first timing control signal is at a high potential level and said first timing control signal falls to a low level during a period when said third timing signal is at a low level, and wherein said second and said fourth input terminals are separate input terminals and said fourth timing control signal rises to a high potential level during a period when said second timing control signal is at a high potential level and said second timing control signal falls to a low level during a period when said fourth timing signal is at a low level.

8. A boost voltage generating circuit according to claim 7, wherein said high levels of said third and said fourth timing control signals are boosted to levels higher than said high levels of said first and said second timing control signals, respectively.

* * * * *

UNITED STATES PATENT AND TRADEMARK OFFICE
CERTIFICATE OF CORRECTION

PATENT NO. : 5,521,547
DATED : May 28, 1996
INVENTOR(S) : Shyuichi Tsukada

It is certified that error appears in the above-indentified patent and that said Letters Patent is hereby corrected as shown below:

Column 1, line 39, delete "or(her" and insert therefor --other--.

Signed and Sealed this

Twenty-seventh Day of August, 1996

Attest:

BRUCE LEHMAN

*Attesting Officer*     *Commissioner of Patents and Trademarks*